(12) United States Patent
Wu et al.

(10) Patent No.: US 10,615,046 B2
(45) Date of Patent: Apr. 7, 2020

(54) METHODS OF FORMING SEMICONDUCTOR DEVICES WITH FLOWABLE MATERIAL FOR BETTER PLANARIZATION METHOD

(71) Applicant: Winbond Electronics Corp., Taichung (TW)

(72) Inventors: Kun-Che Wu, Taichung (TW); Kao-Tsair Tsai, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/176,663

(22) Filed: Oct. 31, 2018

(65) Prior Publication Data

US 2019/0304795 A1    Oct. 3, 2019

(30) Foreign Application Priority Data

Apr. 3, 2018  (TW) .............................. 107111842 A

(51) Int. Cl.
*H01L 21/3105* (2006.01)
*H01L 49/02* (2006.01)
*H01L 21/311* (2006.01)
*H01L 21/02* (2006.01)

(52) U.S. Cl.
CPC .. *H01L 21/31053* (2013.01); *H01L 21/02164* (2013.01); *H01L 21/31144* (2013.01); *H01L 28/40* (2013.01)

(58) Field of Classification Search
None
See application file for complete search history.

(56) References Cited

U.S. PATENT DOCUMENTS

| 5,714,779 A | 2/1998 | Auer et al. |
| 5,872,060 A | 2/1999 | Ashigaki et al. |
| 2004/0005518 A1* | 1/2004 | Park ................... H01L 21/0273 430/314 |

FOREIGN PATENT DOCUMENTS

TW        200805559 A    1/2008

* cited by examiner

*Primary Examiner* — Daniel Whalen
(74) *Attorney, Agent, or Firm* — Muncy, Geissler, Olds & Lowe, PC

(57) ABSTRACT

A method of forming semiconductor devices includes providing a substrate with a patterned material layer formed thereon, forming a material layer on the patterned material layer, wherein the material layer has a first region with a lower top surface and a second region with a higher top surface, forming a flowable material layer on the material layer, wherein the flowable material layer exposes at least a portion of the second region of the material layer, removing the exposed portion of the second region of the material layer with the flowable material layer as a stop layer, removing the flowable material layer, and planarizing the material layer.

19 Claims, 7 Drawing Sheets

METHODS OF FORMING SEMICONDUCTOR DEVICES WITH FLOWABLE MATERIAL FOR BETTER PLANARIZATION METHOD

CROSS REFERENCE TO RELATED APPLICATIONS

This application claims priority of Taiwan Patent Application No. 107111842, filed on Apr. 3, 2018, the entirety of which is incorporated by reference herein.

BACKGROUND

Technical Field

The embodiment of the present disclosure relates to methods of forming semiconductor devices, and in particular it relates to methods of planarizing semiconductor devices.

Description of the Related Art

In the manufacturing process of a semiconductor device, it is often necessary to planarize a surface of the semiconductor device to remove excess material, to create a flat surface, or to facilitate the next step in the process.

However, as semiconductor devices have become smaller, the difficulty of manufacturing semiconductor devices has increased dramatically, and undesirable defects may be generated during the planarization process. These defects may negatively affect the performance of the device, or cause the device to become damaged. Therefore, a better planarization method must be found in order to improve the yield of semiconductor devices.

BRIEF SUMMARY

In accordance with some embodiments of the present disclosure, a method of forming semiconductor devices is provided. The method provides a substrate with a patterned material layer thereon; forming a material layer on the patterned material layer, wherein the material layer has a first region with a lower top surface and a second region with a higher top surface; forming a flowable material layer on the material layer, wherein the flowable material layer exposes at least a portion of the second region of the material layer; removing the exposed portion of the second region of the material layer with the flowable material layer as a stop layer; removing the flowable material layer; and planarizing the material layer.

In accordance with some embodiments of the present disclosure, a method of forming semiconductor devices is provided. The method provides a substrate with a patterned material layer thereon; forming a material layer on the patterned material layer, wherein the material layer has a first region with a lower top surface and a second region with a higher top surface; forming a mask covering the first region and a portion of the second region of the material layer; performing an etch process on the material layer to form a protrusion on the material layer; after removing the mask, forming a flowable material layer on the material layer, wherein the flowable material layer exposes the protrusion on the second region of the material layer; removing the protrusion on the second region of the material layer with the flowable material layer as a stop layer; removing the flowable material layer; and planarizing the material layer.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

The following outlines several embodiments so that those skilled in the art may better understand the present disclosure. However, these embodiments are not intended to limit the present disclosure. It is understandable that those skilled in the art may adjust the embodiments described below according to requirements, for example, changing the order of processes or adding other elements.

Figure 1A:
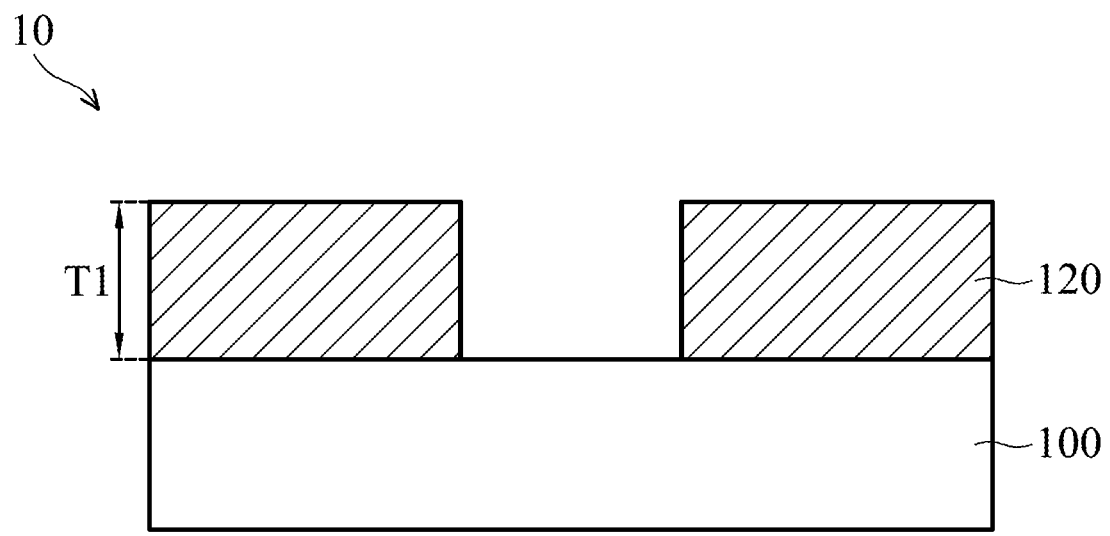
FIGS. 1A-1H are cross-sectional views of a semiconductor device at various stages of manufacture according to some embodiments of the present disclosure.

FIGS. 1A-1H are cross-sectional views illustrating the semiconductor device 10 at various stages of manufacture according to some embodiments of the present disclosure. Referring to FIG. 1A, the semiconductor device 10 includes a substrate 100 and a patterned material layer 120 formed on the substrate 100. The substrate 100 is, for example, any substrate material suitable for a semiconductor device. The patterned material layer 120 may include any element with a step height T1 formed on the substrate 100, and the step height T1 is, for example, greater than about 1.5 µm. In some embodiments, the patterned material layer 120 is, for example, capacitor arrays including a plurality of capacitor elements. Each of the capacitor arrays is spaced apart by a gap to generate the step height T1, wherein the height of the step height T1 is about 1.9 µm. For the convenience of description, the patterned material layer 120 illustrated here has a flat top surface, but the disclosure is not limited thereto, and the patterned material layer 120 may have a concave, convex or other shaped top surface.

Figure 1B:
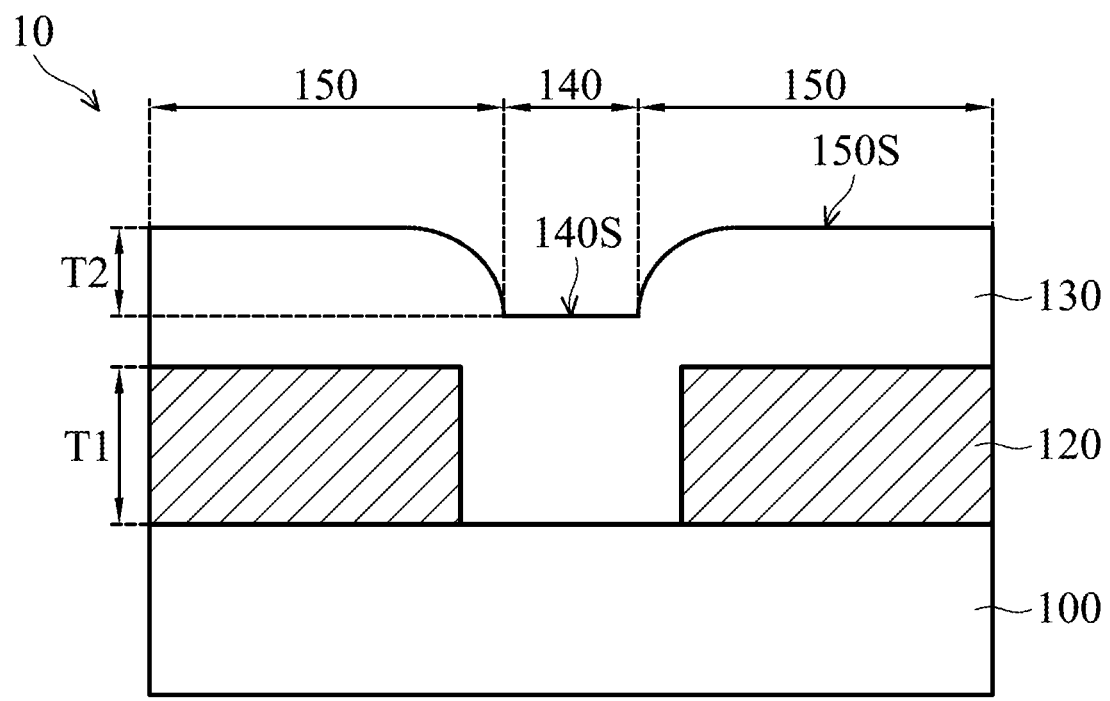

Referring to FIG. 1B, a material layer 130 is formed on the patterned material layer 120. In some embodiments, the material layer 130 may include a dielectric material, and thus the material layer 130 may also be referred to as a dielectric layer. In some embodiments, materials of the material layer 130 may include silicate glass or oxide, for example, tetraethoxysilane (TEOS) oxide, phosphosilicate glass (PSG), borosilicate glass (BSG), boron-doped phosphosilicate glass (BPSG), the like, or a combination thereof Any method may be used to form the material layer 130 with any suitable thickness.

Due to the presence of the step height T1, the material layer 130 would have a top surface 140S of a first region 140 and a top surface 150S of a second region 150, and the top surface 150S of the second region 150 is higher than the top surface 140S of the first region 140, and there is a step height T2 between the top surface 140S and the top surface 150S.

In some embodiments, the first region 140 is substantially directly above the gap between the patterned material layer 120, and the second region 150 is substantially directly above the patterned material layer 120. In some embodiments, the step height T1 is about 1.75 μm and the step height T2 is about 1.9 μm.

Figure 1C:
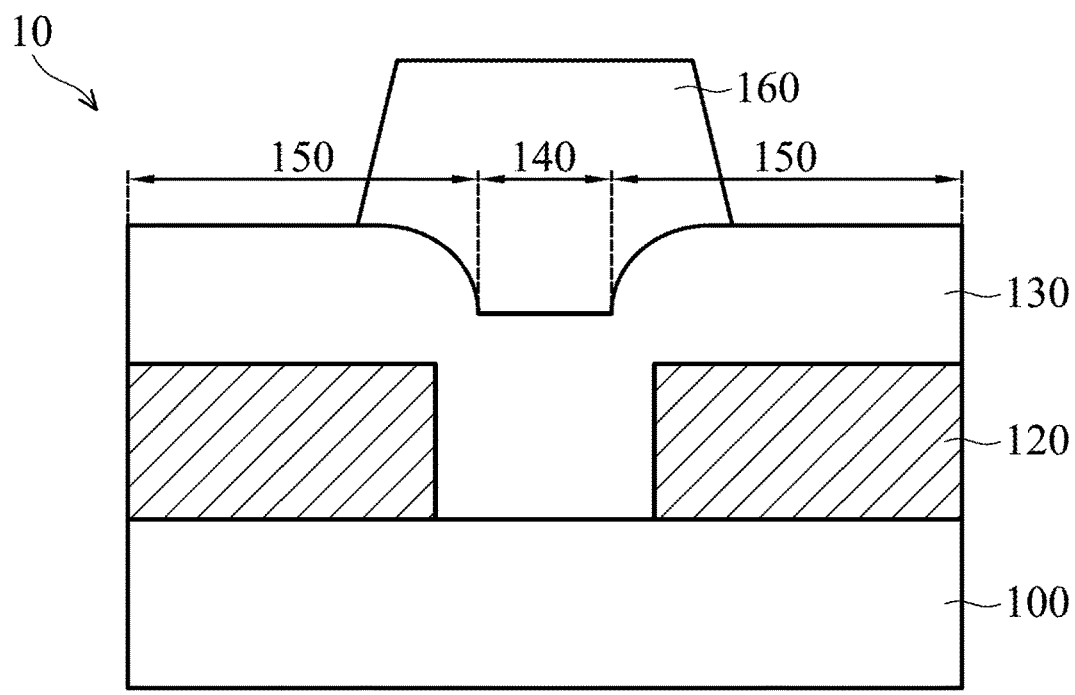

Referring to FIG. 1C, a mask 160 is formed on the material layer 130. The mask 160 substantially covers the first region 140 of the material layer 130 and exposes a portion of the second region 150 of the material layer 130. The mask 160 may comprise any suitable material, for example, silicon nitride (SiN), silicon oxynitride (SiON), silicon carbide (SiC), silicon carbonitride (SiCN), silicon oxycarbonitride (SiOCN), or the like. The mask 160 may be formed by using any suitable method.

Figure 1D:
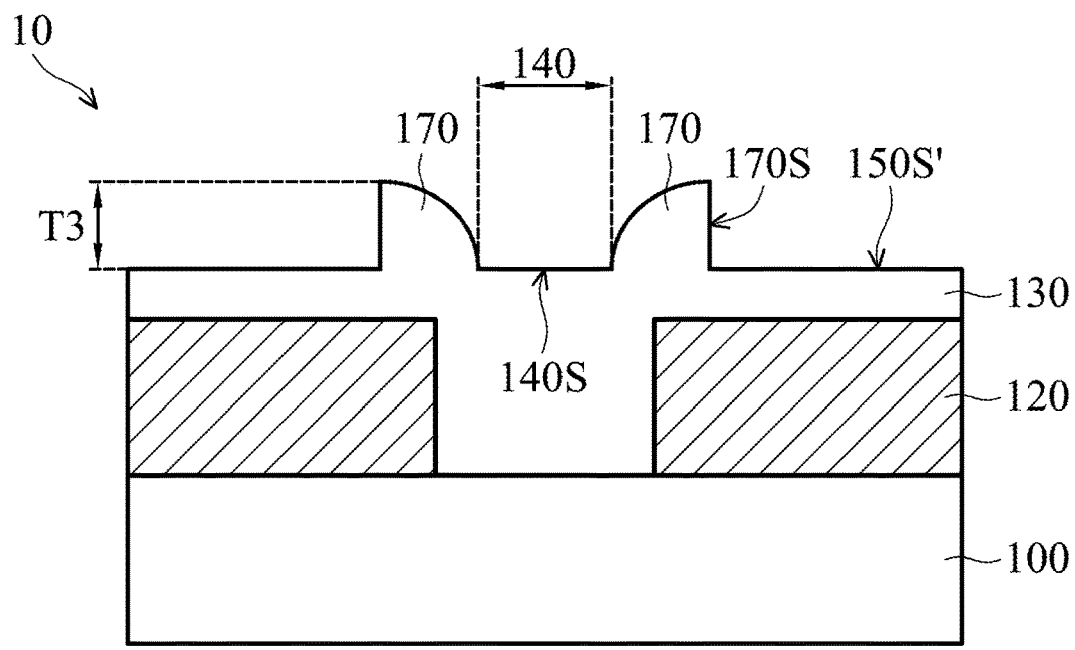

Referring to FIG. 1D, an etch process is performed to remove the portion of the material layer 130 not covered by the mask 160. The etch process described above is, for example, a reactive ion etch (RIE), a neutron beam etch (NBE), the like, or a combination thereof. As illustrated, after the etch process is performed, the portion of the second region 150 of the material layer 130 is removed to form a reduced top surface 150S'. Next, the mask 160 is removed, and a protrusion 170 formed on the material layer 130 is exposed. For ease of description, the top surface 150S' illustrated here is perpendicular to a sidewall 170S of the protrusion 170, but the present disclosure is not limited thereto. The angle between the sidewall 170S of the protrusion 170 and the top surface 150S' may be less than 90° or greater than 90°, and both the sidewall 170S of the protrusion 170 and the top surface 150S' may be flat, convex, concave, or another topography. In addition, the height of the top surface 150S' illustrated herein is the same as the height of the top surface 140S of the first region 140, but in some embodiments, the height of the top surface 150S' may be higher or lower than the height of the top surface 140S of the first region 140. In addition, there is a step height T3 between the highest point of the protrusion 170 and the top surface 150S'. In some embodiments, the step height T3 is about 1.9 μm.

Figure 1E:
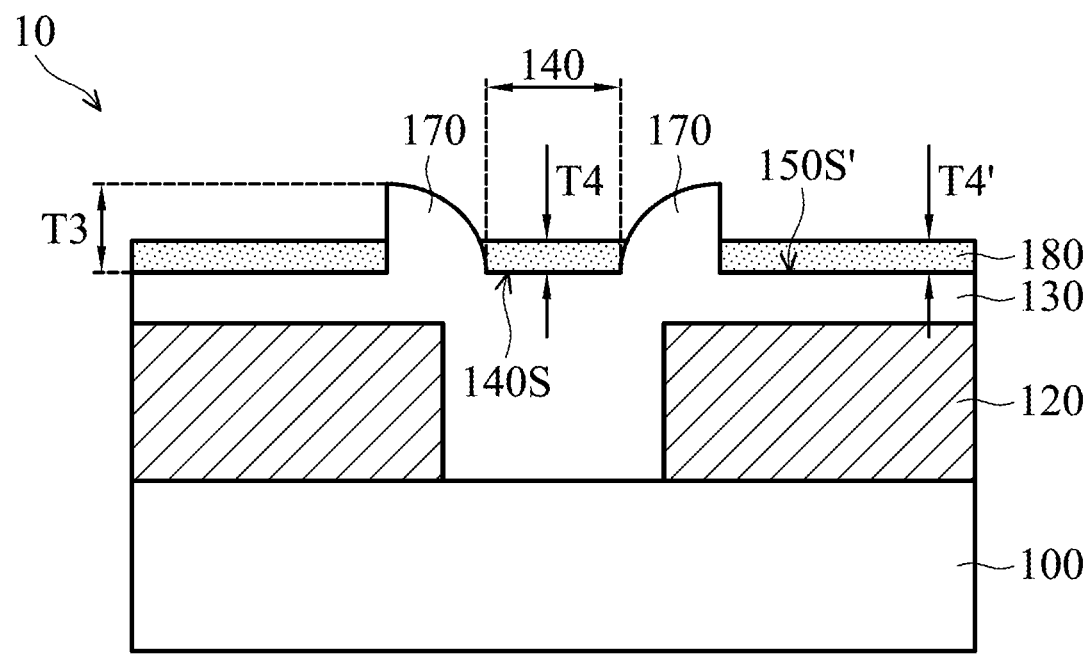

Referring to FIG. 1E, a flowable material layer 180 is formed on the material layer 130. The flowable material layer 180 covers the top surface 150S' and the top surface 140S of the material layer 130, and a portion of the protrusion 170 of the second region 150 of the material layer 130 is exposed. The method of forming the flowable material layer 180 involves forming a flowable material on the material layer 130 by performing, for example, Physical Vapor Deposition (PVD), Chemical Vapor Deposition (CVD), spin-on coating, or the like, and then baking to cure the flowable material into the flowable material layer 180. In some embodiments, the flowable material comprises polymers. In some embodiments, the flowable material comprises a photoresist material, spin-on carbon (SOC), spin-on glass (SOG), spin-on organic hard mask (SOH), an organic planarization layer (OPL), amorphous carbon (APF), an anti-reflective coating (ARC) material, the like, or a combination thereof.

It should be noted that the fluidity of the flowable material may cause the flowable material layer 180 formed on the material layer 130 to have an uneven thickness and a top surface of uniform height. The top surface of the flowable material may be controlled to expose the portion of the protrusion 170 of the second region 150 of the material layer 130.

As shown in FIG. 1E, the flowable material layer 180 on the top surface 140S of the material layer 130 has a thickness T4, and the flowable material layer 180 on the top surface 150S' of the material layer 130 has a thickness T4'. For ease of description, the thickness T4 illustrated herein is equal to the thickness T4', but in some embodiments, the thickness T4 may be greater or less than the thickness T4'. The thickness T4 is in a range of about 100 nm to about 400 nm, and the thickness T4' is in a range of about 100 nm to about 400 nm. For example, in some embodiments, the thickness T4 is about 0.2 μm and the thickness T4' is about 0.2 μm. In some embodiments, a ratio (T4/T2) of the thickness T4 of the flowable material layer 180 to the step height T2 between the top surface 140S and the top surface 150S is greater than about 0.05. In some embodiments, a ratio (T4'/T3) of the thickness T4' of the flowable material layer 180 to the step height T3 of the protrusion 170 is greater than about 0.05.

Figure 1F:
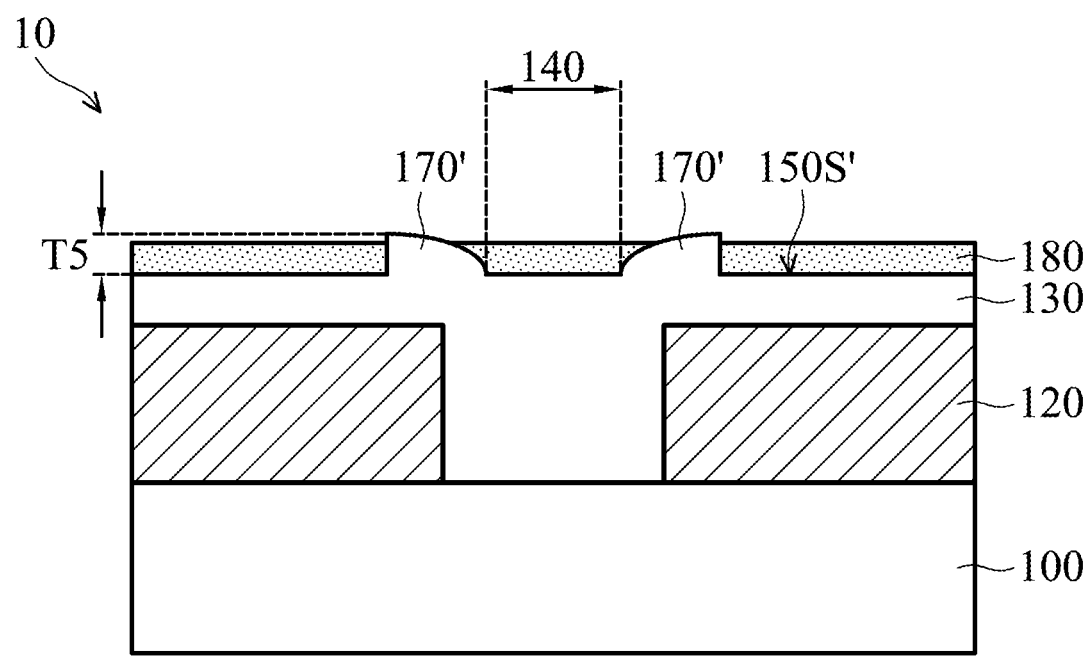

Then, as shown in FIG. 1F, the portion of the protrusion 170 of the material layer 130 is removed to form a protrusion 170'. The method of removing the portion of the protrusion 170 may include an etch process, such as a dry etch, a wet etch, the like, or a combination thereof. The etch process has an etch selectivity of the material layer 130 to the flowable material layer 180, to selectively remove the portion of the protrusions 170 of the material layer 130. For example, the etch selectivity is between about 3 and about 9. In one embodiment, for example, the portion of the protrusion 170 is removed by using an etch process with an etch selectivity of 6 of the material layer 130 to the flowable material layer 180. In addition, in some embodiments, for example, the protrusion 170' is formed by removing the portion of the protrusion 170 with the flowable material layer 180 as an etch stop layer.

As shown in FIG. 1F, there is a step height T5 between the highest point of the protrusion 170' and the top surface 150S', and the step height T5 is smaller than the step height T2 between the top surface 140S and the top surface 150S shown in FIG. 1B. In some embodiments, a ratio (T5/T3) of the step height T5 of the protrusion 170' to the step height T3 of the original protrusion 170 is about ¼ to about ½, or about ⅓. In some embodiments, the step height T5 of the protrusion 170' is less than about 0.7 μm, or about 0.5 μm.

Figure 1G:
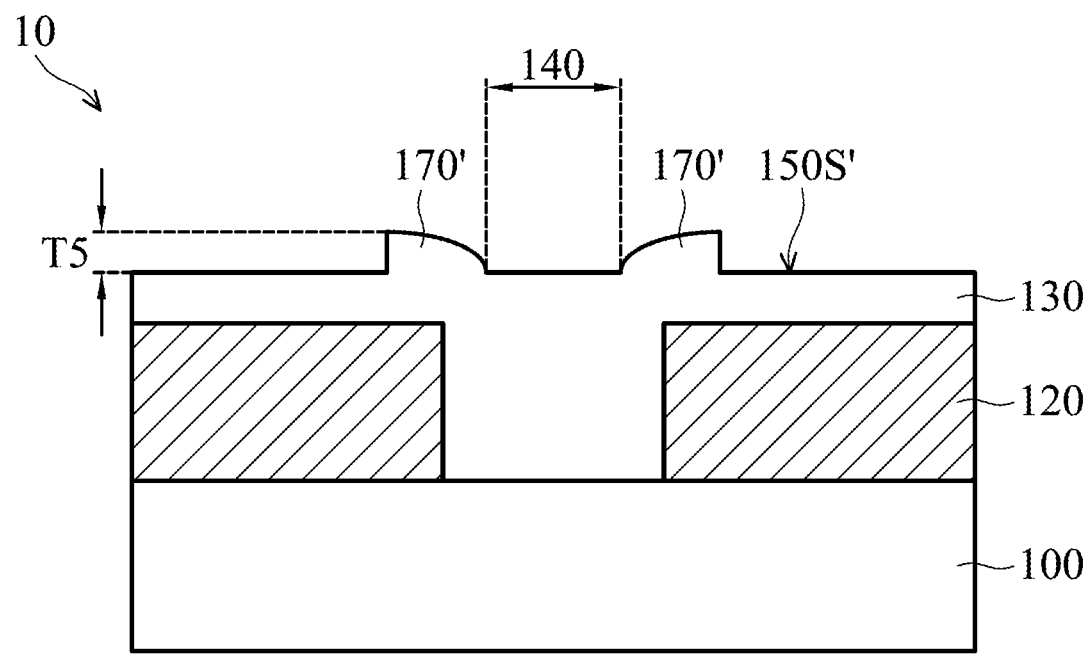

Then, referring to FIG. 1G, the flowable material layer 180 is removed. The flowable material layer 180 may be removed by using any suitable process, for example, when the flowable material layer 180 is a photoresist material, a photoresist stripping process may be used to remove the flowable material layer 180.

Figure 1H:
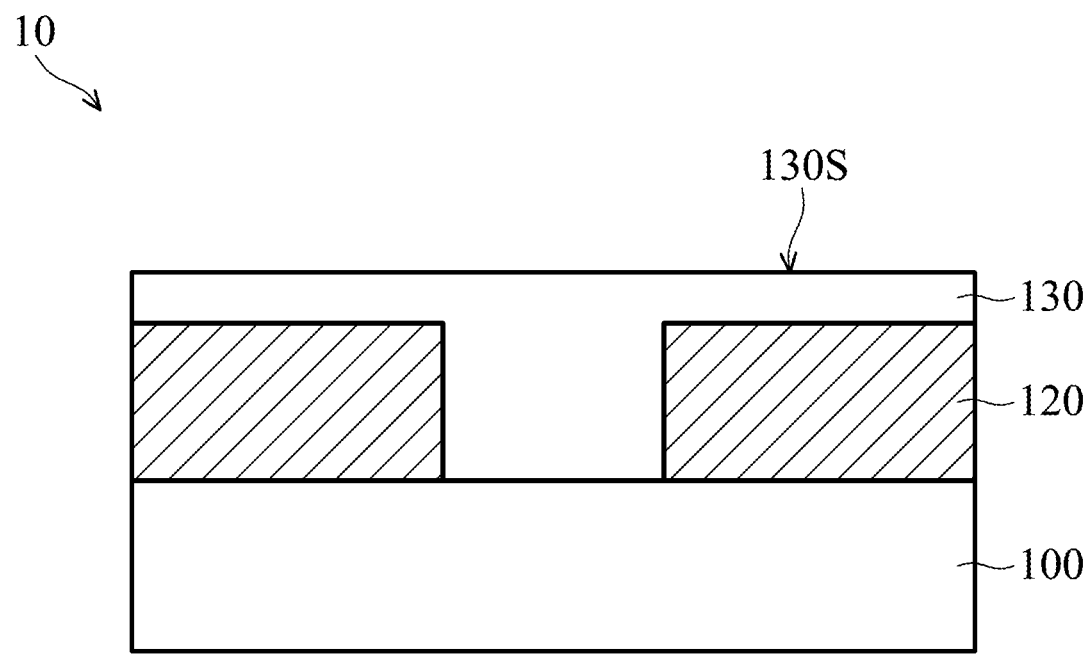

Next, referring to FIG. 1H, a planarization process on the material layer 130 is performed. The material layer 130 may be planarized by using any suitable process, such as a chemical mechanical polishing process or the like. After the planarization process, the material layer 130 has a top surface 130S which is substantially flat.

According to some embodiments of the present disclosure, after a material layer is covered with a mask and a portion of the material layer not covered by the mask is etched to form a protrusion of the material layer covered by the mask, a step height between the highest point and the lowest point of the material layer (for example, the step height is reduced from the step height T2 in FIG. 1B to the step height T5 in FIG. 1G) can be reduced by forming a flowable material layer covering the material layer and only exposing the protrusion of the material layer, then removing the exposed portion of the protrusion. Thereby, a stress generated during the subsequent planarization process is reduced, and the material layer may be prevented from the formation of cracks or gaps which are formed by removing a part of the material layer during the planarization process.

The cracks or the gaps in the material layer would have negative effects on subsequent processes. For example, when a conductive material is formed on the material layer, the conductive material may be deposited in the cracks or the gaps, and additional conductive paths is created, led to a device failure or a yield loss. Therefore, the method provided according to some embodiments of the present disclosure can improve the yield and reliability of a semiconductor device.

Figure 2A:
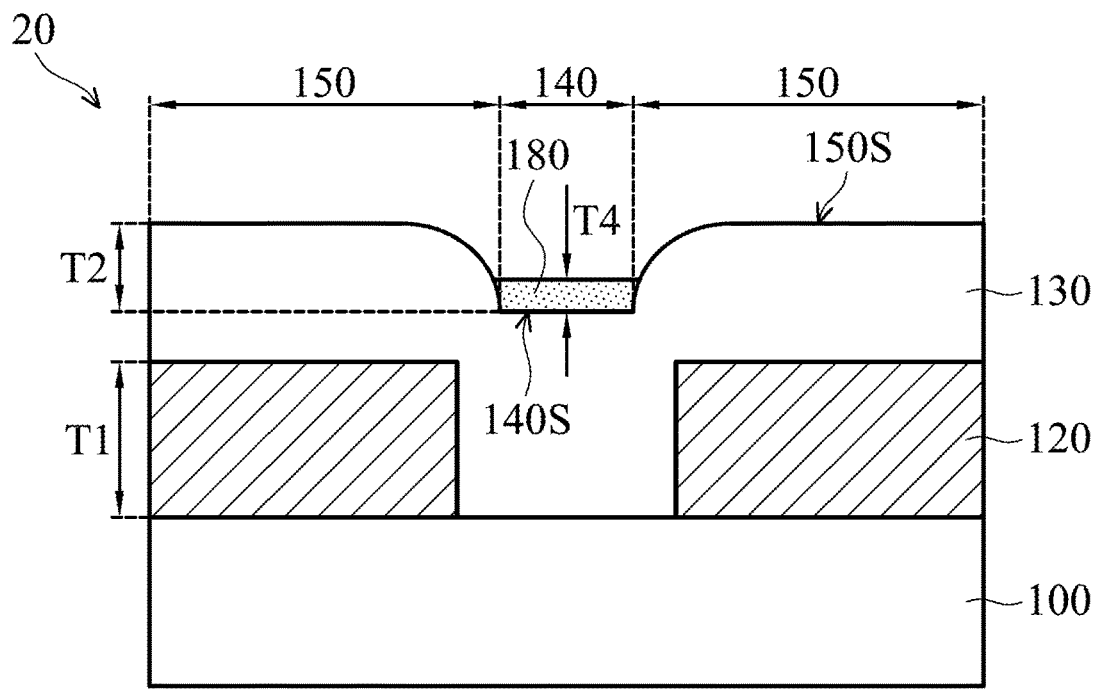
FIGS. 2A-2D are cross-sectional views of a semiconductor device at various stages of manufacture according to another embodiments of the present disclosure.

FIGS. 2A-2D are cross-sectional views of a semiconductor device 20 at various stages of manufacture according to another embodiments of the present disclosure. Referring to FIG. 2A, the semiconductor device 20 includes a substrate 100, a patterned material layer 120 and a material layer 130 formed on the substrate 100. Materials, forming methods and structures of the substrate 100, the patterned material layer 120, and the material layer 130 are similar to the substrate 100, the patterned material layer 120, and the material layer 130 in FIGS. 1A-1B, and will not be repeated here.

Referring to FIG. 2A, similarly, the material layer 130 has a top surface 140S of a first region 140 and a top surface 150S of a second region 150, and the top surface 150S of the second region 150 is higher than the top of the first region 140. There is a step height T2 between the top surface 140S and the top surface 150S.

Next, a flowable material is formed on the material layer 130. The flowable material covers the top surface 140S of the material layer 130 and exposes a portion of the material layer 130 of the second region 150. In some embodiments, the flowable material comprises polymers. In some embodiments, the flowable material is, for example, a photoresist material, spin-on carbon, spin-on glass, a spin-on organic hard mask material, an organic planarization layer material, amorphous carbon, an anti-reflection film material, the like, or a combination thereof. A method of forming the flowable material is, for example, physical vapor deposition, chemical vapor deposition, spin coating, the like, or a combination thereof.

It should be noted that the fluidity of the flowable material may cause the flowable material formed on the material layer 130 to have an uneven thickness and a top surface of uniform height, and a portion of the second region 150 of the material layer 130 may be substantially exposed.

Figure 2B:
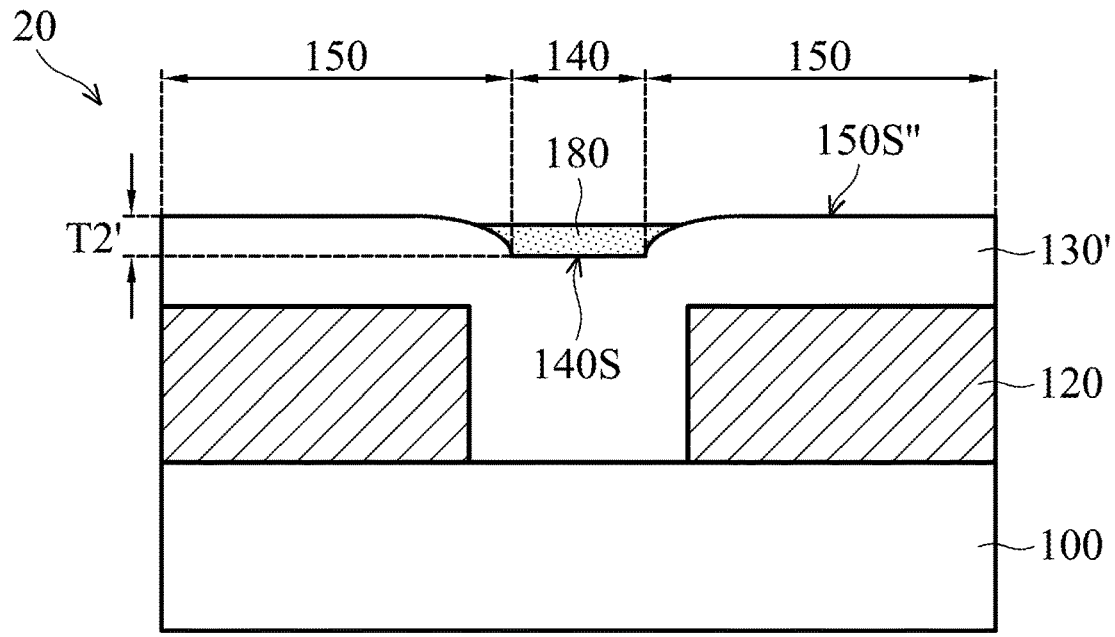

After the flowable material is formed, the flowable material is baked so that the flowable material is cured to form a flowable material layer 180. Then, as shown in FIG. 2B, the exposed portion of the material layer 130 of the second region 150 is removed to form a material layer 130'. The method for removing the exposed portion of the material layer 130 of the second region 150 may include an etch process, for example, a dry etch, a wet etch, the like, or a combination thereof. The etch process has an etch selectivity of the material layer 130 to the flowable material layer 180, to selectively remove the exposed portion of the second region 150 of the material layer 130. For example, the etch selectivity is between about 3 and about 9. In one embodiment, for example, the exposed portion of the second region 150 of the material layer 130 is removed by using an etch process with an etch selectivity of 6 of the material layer 130 to the flowable material layer 180.

As shown in FIG. 2A, a flowable material layer 180 formed on the material layer 130 has a thickness T4 on the top surface 140S of the first region 140. In some embodiments, the thickness T4 is in a range between about 100 nm to about 400 nm, for example, the thickness T4 is about 200 nm. In some embodiments, a ratio (T4/T2) of the thickness T4 of the flowable material layer 180 to a step height T2 of the top surface 140S and the top surface 150S is greater than about 0.05.

As shown in FIG. 2B, a material layer 130' of the second region 150 has a lowered top surface 150S", and there is a step height T2' between the top surface 150S" and the top surface 140. In some embodiments, a ratio (T2'/T2) of the step height T2' to the step height T2 between the original top surface 150S and the top surface 140 is between about ¼ and about ½, such as about ⅓. In some embodiments, the step height T2' is less than about 0.7 μm, for example, the step height T2' is about 0.5 μm.

Figure 2C:
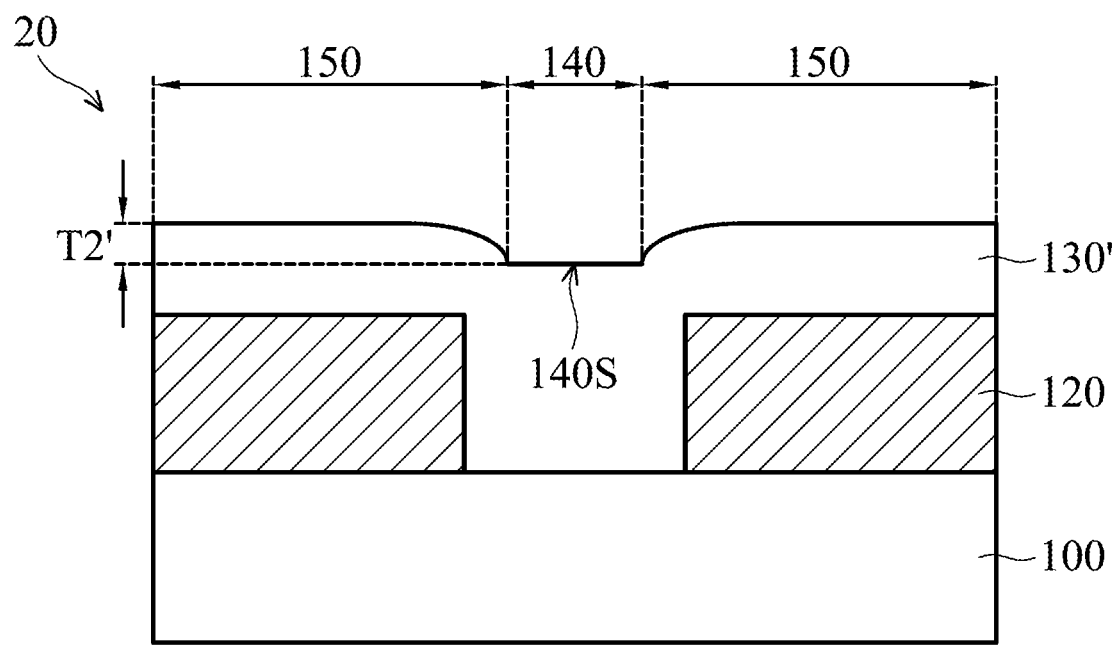

Then, referring to FIG. 2C, the flowable material layer 180 is removed. The flowable material layer 180 may be removed by using any suitable process, for example, when the flowable material layer 180 is a photoresist material, the photoresist stripping process may be used to remove the flowable material layer 180.

Figure 2D:
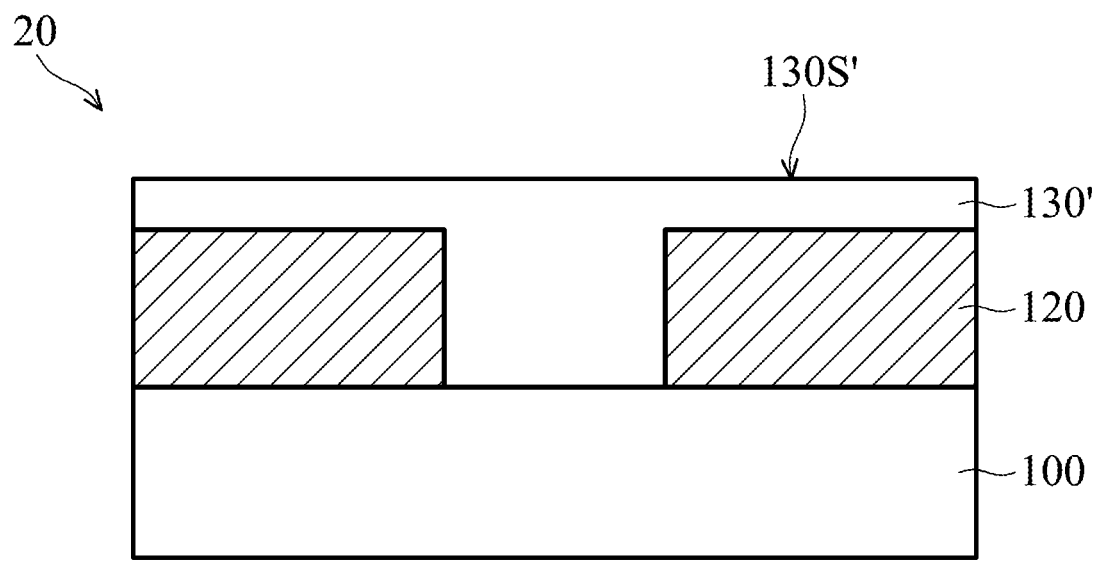

Then, referring to FIG. 2D, a planarization process on the material layer 130' is performed. The material layer 130' may be planarized by using any suitable process, such as a chemical mechanical polishing process or the like. After the planarization process, the material layer 130' has a top surface 130S' which is substantially flat.

According to some embodiments of the present disclosure, a flowable material may be formed on a material layer with a plurality of regions having top surfaces with different heights, a higher region of the top surface of the material layer is exposed, and the higher region of the top surface is removed. Thereby, the step height of between the top surfaces of different regions of the material layer (for example, from T2 in FIG. 2A to T2' in FIG. 2B) can be effectively reduced. In addition, since the flowable material can be easily formed on a rugged pattern on the substrate to form a flowable material layer having an uneven thickness but a top surface with a uniform height, and the flowable material layer undergone being baked and cured can be removed merely by simple steps (such as photoresist stripping) without using photolithography and etch processes, thereby the complexity of processes can be significantly reduced.

Figure 3:
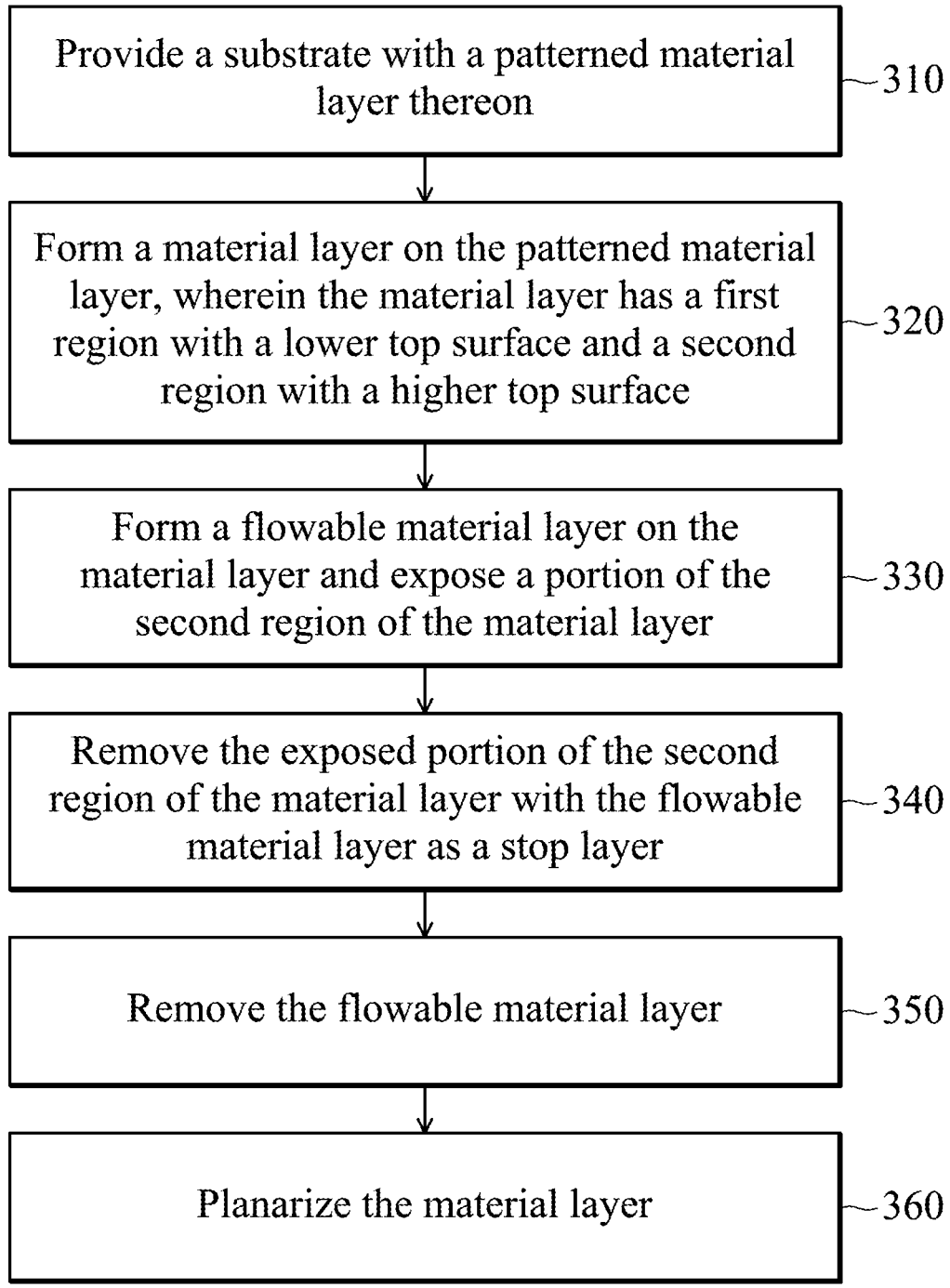
FIG. 3 is a flow chart illustrating a method of manufacturing a semiconductor device according to some embodiments.

FIG. 3 is a flow chart illustrating a method of manufacturing a semiconductor device according to some embodiments. Referring to FIG. 3, a substrate with a patterned material layer thereon is provided first (step 310). Next, a material layer is formed on the patterned material layer (step 320), wherein the material layer has a first region with a lower top surface and a second region with a higher top surface. Then, a flowable material layer is formed on the material layer (step 330). The flowable material layer covers the first region and a portion of the second region, and at least a portion of the second region of the material layer is exposed, and the flowable material layer is formed by forming a flowable material on the material layer following by baking to cure. Thereafter, the exposed material layer of the second region is removed with the flowable material layer as a stop layer (step 340). Next, the flowable material layer is removed (step 350). Then, the material layer is planarized (step 360).

FIG. 3 is merely illustrative. In other embodiments, photolithography and etching steps may also be included prior to step 330. For example, before forming the flowable material layer, a mask may be selectively formed on the material layer to cover the first region and a portion of the second region of the material layer, and an etch process may be performed on the material layer to form a protrusion of the second region of the material layer. Next, after the mask is removed, when the flowable material layer is formed in step 330, the flowable material covers most of the second region of the material layer besides the first region of the material layer, and only the protrusion of the second region of the material layer is exposed.

In summary, according to some embodiments of the present disclosure, a flowable material may be formed on a material layer with a plurality of regions having top surfaces with different heights to reduce a step height between the regions of the material layer before a planarization process. The stress of the material layer during the planarization process may be avoided or reduced, and cracks or gaps are prevented from forming in the material layer by the planarization process, improving the yield and reliability of the semiconductor device.

What is claimed is:

1. A method of forming semiconductor devices, comprising:
   providing a substrate with a patterned material layer thereon;
   forming a material layer on the patterned material layer, wherein the material layer has a first region with a lower top surface and a second region with a higher top surface;
   forming a flowable material on the material layer to expose at least a portion of the second region of the material layer, wherein the flowable material has a top surface in parallel with a level surface, and the top surface extends across an entirety of the flowable material;
   curing the flowable material to form a flowable material layer after the flowable material exposes the exposed portion of the material layer at the second region;
   removing the exposed portion of the second region of the material layer with the flowable material layer as a stop layer;
   removing the flowable material layer; and
   planarizing the material layer.

2. The method as claimed in claim 1, further comprising:
   before forming the flowable material layer, forming a mask covering the first region and a portion of the second region of the material layer, and performing an etch process on the material layer to form a protrusion on the material layer; and
   after removing the mask, forming the flowable material layer on the material layer, wherein the flowable material layer exposes the protrusion of the second region of the material layer.

3. The method as claimed in claim 1, wherein the patterned material layer has a step height of greater than 1.5 μm.

4. The method as claimed in claim 1, wherein the patterned material layer comprises a capacitor array.

5. The method as claimed in claim 1, wherein removing the exposed portion of the second region of the material layer with the flowable material layer as the stop layer comprises reducing a height of the exposed portion of the material layer to ¼ to ½ of its original height.

6. The method as claimed in claim 1, wherein removing the exposed portion of the second region of the material layer with the flowable material layer as the stop layer comprises an etch process, in which an etch selectivity of the material layer to the flowable material layer is 3 to 9.

7. The semiconductor structure as claimed in claim 1, wherein the material layer comprises silicate glass or oxide.

8. The semiconductor structure as claimed in claim 1, wherein the flowable material layer has a thickness between 100 nm and 400 nm.

9. The semiconductor structure as claimed in claim 1, wherein the flowable material layer comprises a photoresist material, spin-on carbon, spin-on glass, a spin-on organic hard mask material, an anti-reflection film material, an organic planarization layer material, amorphous carbon, or a combination thereof.

10. The semiconductor structure as claimed in claim 1, wherein a ratio of a thickness of the flowable material layer to a step height between the first region and the second region of the material layer is greater than 0.05.

11. A method of forming semiconductor devices, comprising:
    providing a substrate with a patterned material layer thereon;
    forming a material layer on the patterned material layer, wherein the material layer has a first region with a lower top surface and a second region with a higher top surface;
    forming a mask covering the first region and a portion of the second region of the material layer;
    performing an etch process on the material layer to form a protrusion on the material layer;
    after removing the mask, forming a flowable material layer on the material layer, wherein the flowable material layer exposes the protrusion on the second region of the material layer;
    removing the protrusion on the second region of the material layer with the flowable material layer as a stop layer;
    removing the flowable material layer; and
    planarizing the material layer.

12. The method as claimed in claim 11, wherein the patterned material layer comprises a capacitor array having a step height of greater than 1.5 μm.

13. The method as claimed in claim 11, wherein forming the flowable material layer comprises forming a flowable material on the material layer, and curing the flowable material after the flowable material exposes the protrusion on the second region of the material layer.

14. The method as claimed in claim 11, wherein removing the exposed portion of the second region of the material layer with the flowable material layer as a stop layer comprises reducing a height of the exposed portion of the material layer to ¼ to ½ of its original height.

15. The method as claimed in claim 11, wherein removing the exposed portion of the second region of the material layer with the flowable material layer as the stop layer comprises an etch process, in which an etch selectivity of the material layer to the flowable material layer is 3 to 9.

16. The semiconductor structure as claimed in claim 11, wherein the material layer comprises silicate glass or oxide.

17. The semiconductor structure as claimed in claim 11, wherein the flowable material layer has a thickness between 100 nm and 400 nm.

18. The semiconductor structure as claimed in claim 11, wherein the flowable material layer comprises a photoresist material, spin-on carbon, spin-on glass, a spin-on organic hardmask material, an anti-reflection film material, an organic planarization layer material, amorphous carbon, or a combination thereof.

19. The semiconductor structure as claimed in claim 11, wherein a ratio of the thickness of the flowable material layer to the step height between the first region and the second region of the material layer is greater than 0.05.

* * * * *